United States Patent [19]

Lanzerotti et al.

[11] Patent Number: 5,351,261
[45] Date of Patent: Sep. 27, 1994

[54] INTEGRATED OPTICS

[75] Inventors: Louis D. Lanzerotti, Morristown; Samuel L. McCall, Chatham; Bernard Yurke, Plainfield, all of N.J.

[73] Assignee: AT&T Bell Laboratories, Murray Hill, N.J.

[21] Appl. No.: 48,533

[22] Filed: Apr. 14, 1993

[51] Int. Cl.$^5$ .............................................. H01S 3/08
[52] U.S. Cl. ........................................ 372/98; 372/99
[58] Field of Search ....................... 372/96, 98, 99, 6; 385/37, 77

[56] References Cited

U.S. PATENT DOCUMENTS 4,958,357  9/1990  Kinoshita .............................. 372/96

OTHER PUBLICATIONS

S. L. McCall et al., "Whispering-Gallery Mode Microdisk Lasers", *Appl. Phys. Lett.*, 60(3), Jan. 20, 1992.
A. F. J. Levi et al., "Directional Light Coupling from Microdisk Lasers", *Appl. Phys. Lett.*, 62(6), Feb. 8, 1993.
Y. H. Lee et al., "Room-Temperature Continuous-wave Vertical-Cavity Single-Quantum-Well microlaser Diodes", *Electronics Letters*, 25(20), pp. 1377–1378, Sep. 28, 1989.
*American Institute of Physics Handbook*, 2nd ed., (McGraw-Hill, Jan. 1963), at p. 6–112.

*Primary Examiner*—John D. Lee
*Assistant Examiner*—Robert E. Wise
*Attorney, Agent, or Firm*—George S. Indig

[57] ABSTRACT

Lasing threshold for a whispering mode laser is reduced by appropriate placement of a reflector. A reflector parallel to, and within a wavelength distance of, the disk decreases radiation loss due to imperfect internal reflection. Enhancement is calculable on the basis of destructive interference between reflected and direct radiation.

23 Claims, 4 Drawing Sheets

INTEGRATED OPTICS

FIELD OF THE INVENTION

The invention is directed to integrated optical circuitry containing one or more high Q resonant disk elements.

DESCRIPTION OF THE PRIOR ART

Commercial integrated optics has been anticipated for many years. The hope of optical circuitry to supplement or even to replace electronic circuitry, came about soon after the initial conception of the laser. Emergence of the Surface Emitting Laser (SEL) gave hope of satisfaction. Considerable effort advanced this approach to achievement of single quantum well operation, to reduce threshold and; in consequence, to lowered $I^2R$ loss—the nemesis of earlier efforts.

The SEL, however, is a demanding structure. Operation depends on top and bottom Distributed Bragg Reflectors (DBR). The DBRs, in turn, require growth of many successive paired layers of lattice-matched materials of carefully controlled thickness. Usual arrangements provide for electrically biasing through the DBRs, so that materials must meet conductivity as well as optical requirements. SELs have typically been constructed of material which is lattice-matched to GaAs which is a material of choice for both optical and electrical requirements. A particular approach uses InGaAs quantum wells which have fast surface carrier recombination to result in losses.

The SEL is a vertical (out-of-plane) emitter. Attempts to redirect emission in-plane, e.g., by use of prisms, only adds further complication. The general consensus is that its $I^2R$ loss, perhaps requiring heat sinking, together with other limitations described, leaves the field open to other entrants.

Recently, the microdisk laser design was put forward as appropriate for integrated optics. The microdisk may serve for a variety of non-lasing devices, inter alia, a variety of two-port and three-port devices providing for modulation or for amplification, for switches (both on/off and direction selective). (See, co-pending U.S. patent application Ser. No. 07/943943, filed Sep. 11, 1992.)

There is a continuing effort to optimize the microdisk. Its natural emission direction, while parallel to the plane, is fan-like, emitting uniformly about its entire 360° periphery.

An inherent advantage of the microdisk is dependence on internal reflection, and, accordingly, avoidance of DBRs. Internal reflection, however, even from a perfect surface is accompanied by some leakage which increases with angle of incidence. Reduction in disk size increases angle of incidence in the modal path to result in greater leakage.

SUMMARY OF THE INVENTION

The invention offers a means for reducing energy leakage from optical paths constrained by curved surfaces. Retention of energy by such surfaces is by internal reflection. Unlike planar surfaces, internal reflection by a curved surface necessarily entails some loss—loss due to incomplete internal reflection. This is of consequence for the microdisk laser in which retention of the lasing mode is by internal reflection within the periphery of the disk. Reduced leakage permits reduced disk size and/or reduced lasing threshold. Resonant microdisk structures may also serve a number of non-laser purposes. These include on-off switches, spatial switches (for selection of exit port), modulators and amplifiers. The inventive approach reduces power requirement for these devices. Integrated optic circuitry may include curved-path planar waveguides. Energy loss at outside bends is suitably addressed as well.

The inventive teaching is in terms of destructive interference of escaping radiation. Placement of a reflecting surface parallel and close to the emitting structure results in increased path length and in destructive interference of reflecting radiation with non-reflecting (directly escaping) radiation. While conditions vary, contemplated laser structures may operate at halved threshold value or less. Improvement in performance of other included elements may be comparable.

The invention offers lessening of unwanted radiation without interfering with desired emission. The reflecting interference surface has little or no effect on a waveguide positioned close to the structure. Directionality may be provided for free space radiation as well. The inverse of the effect offers means for imparting directionality. A discontinuous or eccentric spaced mirror may be regarded as permitting effective coupling (may be regarded as not improving leakage for emitting regions which are not reflectively coupled). A mirror, notched at an emitting region, is illustrative of a variety of mirror configurations which may be used for this purpose.

Use of interfering mirrors is generally contemplated for devices which produce or depend for their operation on coherent energy. The principle of operation is, however, equally applicable to incoherent radiation. Effective design profits from the narrower directional spectrum of coherent energy, particularly, as emanating from a microdisk laser.

Study leading to the invention shows feasibility for a microdisk laser operating in TM mode. In combination with previously taught TE mode structures, the circuit designer will now have the flexibility of choice to suit a variety of circuit needs. The interfering mirror of the invention unexpectedly results in an enhancement factor at least as great—perhaps larger—than that for TE mode operation. Availability of this alternative may serve in a variety of ways—trading diameter for the greater quantum well thickness required for TM may permit some improvement in compactness. Feasibility of TM operation is useful in other disk devices as well as in waveguides.

TERMINOLOGY

Figure 1:
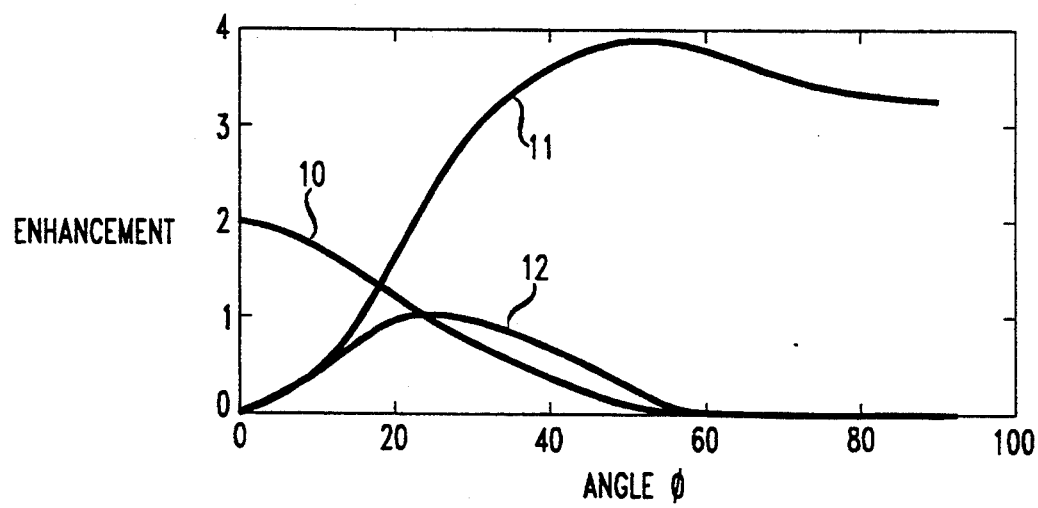
FIGS. 1, 2, 3, and 4, on coordinates of enhancement factor and angle of incidence, relate these quantities for TE or TM devices, each for 2 representative mode numbers.

Interfering Mirror—This is the reflecting surface provided in conjunction with elements of the invention for decreasing loss due to leakage radiation. The mirror may be a single layer reflector, or may be a many-layered distributed reflector. For the prime purpose of decreasing loss, a many-layered structure may operate on DBR principle. Under suitable circumstances, it may deviate from planarity—may be curved to "follow" the redirecting radiation to increase the fraction reflected.

Element of the Invention—The term is used here to encompass contemplated structures. These include resonant cavities—sometimes designed to operate above lasing threshold—as well as waveguides and other non-resonant structures with curved optical paths conforming with an outside bend in the structure.

Disk—This is the functioning region, for many contemplated devices the active-region-containing portion of the structure responsible for electromagnetic emission, always of some degree of coherence as regards emitting devices—"emitters" as here defined. While for tutorial purposes this term is generally considered as of circular configuration as defined between parallel surfaces of unvarying spacing, the term is intended to have a more generic meaning. In the generic sense, "disk" defines structures in which preponderant cavitating energy is due to total internal reflection largely within such region(s). It is convenient to refer to the disk as defining a symmetrical structure, e.g. a circular structure. As long as the fundamental requirement for total internal reflection is satisfied, the shape of the disk may be asymmetrical—in fact, providing for an oval structure may be advantageous in terms of coupling either input or output. In any event, a dimension (usually the "thickness" dimension) perpendicular to cavitation direction is but a fraction of a wavelength—a larger fraction for TM operation. This fraction, ordinarily $\leq 0.5\lambda$, and in a category of preferred structures $\approx 0.25\lambda$, for TE operation, is based on wavelength measurement within the structure—taking into account both bulk refractive index and variations introduced by small structural dimensions. The subscript, eff, has reference to effective value so that $n_{eff}$ is a measure of the refractive index taking both factors into account.

Cavitation—the process by which a field is enhanced within a resonant cavity. Loosely, the term "cavitation" is used in lieu of the term "resonance".

Whispering gallery mode/whispering mode—this terminology, familiar to those concerned with internally reflecting spherical as well as cylindrical structures, defines the form of cavitation responsible—usually in whole responsible—for operation of lasers of the invention. Described in somewhat greater detail further on, the operation depends upon internal reflection as resulting from incidence of the cavitating field on a peripheral structure at an angle $\leq$ the "critical angle".

Quantum well—It is generally understood this term refers to deviation from the hypothetical sphere defining the effective region of an exciton—within an effectively limitless medium of constant refractive index. For purposes of this description—for purposes meaningful in terms of device design—the critical dimension of a quantum well must be at least 10% shorter than the diameter of such hypothetical sphere.

Emitter—Device of the invention in which functioning relies on simple emission, i.e. on presence of optical output.

Three-Port Device—a device providing for three or more couplings with the disk—such couplings providing for at least two inputs and one output. Contemplated inputs accommodate pump energy and modulating signal. The output provided for is modulated in accordance with modulating signal(s). While three-port devices may include three position-identifiable couplings, a single physical port may designedly be used for both of the inputs. Such a device is here defined as "three-port" and is to be distinguished from "two-port" devices in accordance with the following definition.

Two-Port Device—a device providing for two couplings only—for a single input and a single output. "Two-port" devices are, accordingly, intended to be descriptive of an "emitter". It is intended to be generic, as well, in contemplating a "modulated output"—an output providing for some intelligence-bearing variation such as, directional change, phase change, amplitude change, as well as simple presence and absence of output (in which presence, absence, interval of on or off is intelligence bearing), etc. Such a modulated output is as contemplated for a three-port device, the difference being that the sole input is an already "modulated" input. The latter form of two-port device makes use of the effective cavitation provided for by the invention in the direct cavitation of input. An example of the latter is a cavity enhanced detector.

Q—The "quality factor" descriptive of cavity loss, proportional to the cavity energy divided by the rate of leakage, so that increasing Q corresponds with decreasing lasing threshold.

DETAILED DESCRIPTION

General—It is convenient to describe the invention in terms of resonant microdisk cavities and particularly in terms of microdisk lasers. It will be understood that use of this terminology is not intended to limit inventive scope. While there are quantitative differences, the teaching is applicable to non-resonant as well as resonant structures.

Spreading radiation from points of incidence assures grazing reflection on a closely placed interfering mirror parallel to the cavity plane. While most effective destructive interference is for the limiting condition of a mirror of infinite extent and for zero angle of incidence, a substantial effect is realized for reflection on a mirror of limited size. Rigorously, the degree of destructive interference is dependent upon angle of incidence, $\phi$. As shown in FIGS. 1-4, there is a rapid increase in enhancement to a critical $\phi$ value, after which the slope of continuing increase lessens. For dimensions and other conditions considered, a centrally located mirror of diameter three times that of the disk captures rays at the critical $\phi$ value. This "extent"—a mirror of size to extend 1 diameter distance beyond the disk—defines a preferred minimum mirror size. Interfering mirrors of this size are found to decrease lasing threshold by twice or greater in illustrative devices.

Microstructures of the invention, while usefully employed as discrete devices, are of primary interest for their value in integrated circuitry. In particular, operating as lasers, permitted low power operation satisfies desire for low threshold consistent with small heat loss. Contribution to this operating desire is advanced by permitted effective matching between small gain volume and a single optical mode—generally the first TE mode. Optical gain for disk modes is provided by one or more optically pumped quantum wells in the plane of the disk. Generally, disk thickness is less than $\lambda/2n_{eff} \approx 2,000\text{Å}$ for $\lambda=1.5$ μm and $n_{eff}=3.5$. Structures are desirably characterized by high index contrast as between the disk and the surrounding medium, in particular, as concerns the disk region of greatest modal energy concentration. This contrast is generally defined as between active material—in accordance with usual structures defined as including active layer(s) together with encompassing spacer/barrier layers. Surrounding media for structures described may be space—e.g., vacuum or air—or some, likely passive, low index medium such as amorphous silica, $SiO_2$. The illustrative values set forth translate into an index contrast (or index ratio) $n_{eff}/n_o$ where $n_o$ equals index of the surrounding medium. Index contrast of this order of magnitude or greater is attainable for likely operating wavelengths which are less than 15 μm. Other considerations having to do e.g., with ease of fabrication, may dictate lesser contrast values. While the teachings of the invention may be implemented by appropriate variation in such design considerations as disk radius, other considerations such as desire for small size for convenient integration, as well as fabrication ease, all suggest values of contrast of a minimum of 1.3 or preferably greater, e.g., greater than 1.5. This high index contrast coupled with sub-$\lambda$ thickness dimension effectively confines the active optical mode/s and is a key feature in assuring effective overlap with the gain layer (i.e., with the active region—generally the quantum well active region).

A characteristic disk structure of the invention, for operation at 1.5 μm, may have the following illustrative dimensions: disk diameter approximately 2 μm; thickness, for a 3 quantum well device operating in TE mode, approximately 0.5 μm; mirror separation, approximately 0.45 μm$\lambda$ (as measured in free space); with the mirror plane extending about 1 diameter distance. The mirror size is, importantly, a function of grazing angle. Omission of reflecting surface in the direction of desired emission leaves this "directed" radiation uneffected (permitted "leakage" is tantamount to "directed" radiation). As discussed further on, it is possible to provide for constructive interference for such directed radiation, to enhance emission.

In general the invention builds on a developed art. Microdisk structures are usually spaced from the supporting substrate by a pedestal. The pedestal is centrally located and sufficiently small so as to have least effect on the peripheral portion of the resonant structure (so as to have least effect on the resonating field). Cavity effectiveness is dependent on the large $\Delta n$ at the air interface. This pedestal structure lends itself to the invention in providing a spacer between the cavity and the mirrored substrate.

It is possible to further improve Q by adding a second interfering mirror above the cavity. Properly spaced, and of proper extent, it is found that addition of the second mirror provides more than a doubling of the advantage of a single mirror. Discussed in further detail in the description of FIG. 4, this disproportionate advantage is a consequence of redirection of escaping radiation by the single mirror.

The chief advantage of the interfering mirror is for regions quite close to radiating surface—for reflective surface regions extending a distance $\leq$ the diameter of the disk. There is diminishing advantage in extending the mirror further. Assurance of mirror within that region is generally sufficient for near-realizable destructive interference. Reflecting mirrors may be segmented—may be of the form shown in FIG. 7.

Expedient fabrication, although with little functional advantage, may be served by a continuous (unsegmented) mirror. This first "ground-plane" mirror, since generally conductive, may serve an electrical function, e.g., to provide a pump electrode. Assuming segmented counterelectrodes, a continuous mirrored surface may be appropriate.

Effective operation depends upon reflectivity from the interfering mirror. Effort to date has concentrated on metals as presenting both high dielectric constants and small penetration depths. The inert noble medals meet both requirements. Gold is more inert than silver. Aluminum bearing its natural oxide, $Al_2O_3$, is suitable. Reactive metals, if suitably protected, may be used. Copper is an excellent reflector for 1.5 μm.

Design Criteria—The value of the enhancement factor, f, is dependent upon the radiation direction angle, $\phi$, above the interfering mirror. [INSERT NEW MATERIAL]. The value of f may be determined from eq. 1.

The Q enhancement factor, F, is given by:

$$F = \frac{\int_0^{\pi/2} (2\sin^{2(M-1)}\phi)d\phi}{\int_0^{\pi/2} (\sin^{2(M-1)}\phi)fd\phi} \quad (1)$$

where:

M = mode number, i.e., the number of wavelengths in the (resonant) modal path.

Note—Equation 1 is true for a (circular) disk—is approximately true for any symmetrical structure.

$$f = |1 + Re^{i\theta}|^2 + 1 - |R|^2, \quad (2)$$

where $$R = (\sin\phi - \sqrt{\epsilon - \cos^2\phi})/ \quad (3)$$

$$(\sin\phi + \sqrt{\epsilon - \cos^2\phi}) \text{ for } TE \text{modes}$$

and $$R = (\epsilon\sin\phi - \sqrt{\epsilon - \cos^2\phi})/ \quad (4)$$

$$(\epsilon\sin\phi + \sqrt{\epsilon - \cos^2\phi}) \text{ for } TM \text{modes}$$

and $$\theta = 4\pi(S/\lambda)\sin\phi \quad (5)$$

$\theta$ is the difference in phase of the direct and reflected wave due to path length difference alone.

$\epsilon$ is the complex dielectric constant. S is the spacing between the disk and the interfering mirror.

The first term in eq. 1 represents the interference effect, and the second term represents loss due to absorption by the interfering mirror. Assuming a gold mirror, the value of $\sqrt{\epsilon}=n+ik$ (where $i=\sqrt{-1}$) is approximately $0.915+8.505i$ for an operating wavelength, $\lambda$, of 1.55 μm (from the American Institute of Physics Handbook, 2nd ed. (McGraw Hill, 1963) at p. 6–112.

Examples are based on a disk-to-mirror spacing of 0.3 λ for a disk resonator of Mode number, 8 (for a disk which is 8 material wavelengths in circumference). The Q enhancement factor, F, for a TE mode device is 2.25.

Reducing the disk size to a circumference of 5 material wavelengths—to a Mode number of 5—results in an enhancement factor of 1.46. The lasing threshold is linearly proportional to the reciprocal of the enhancement factor.

Figure 3:
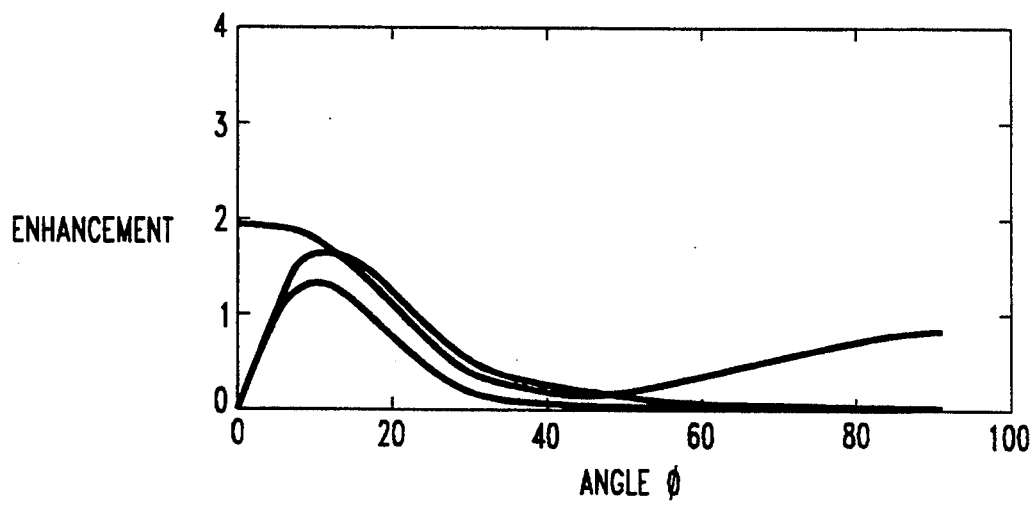
Figure 4:
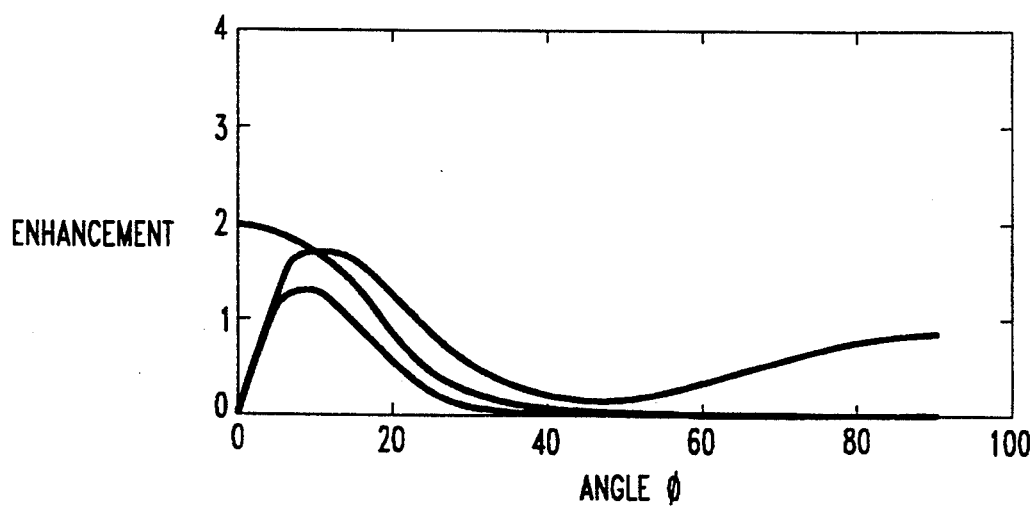
Figure 5:
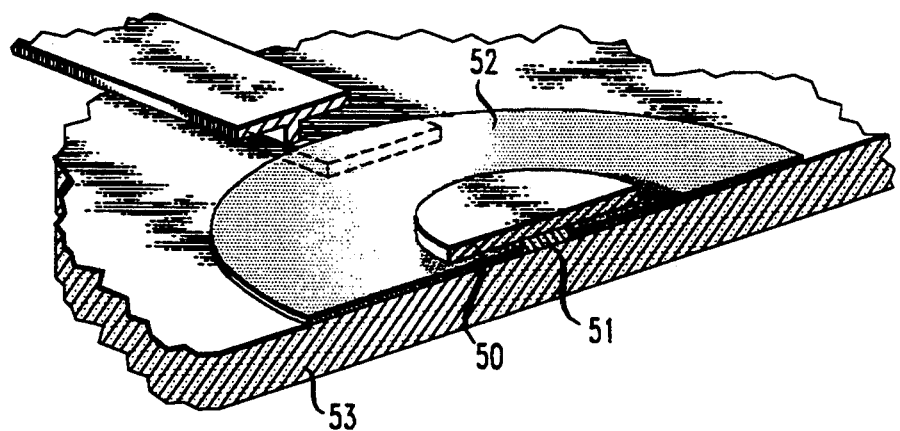
FIG. 5 is a perspective view of a microdisk cavity and interfering mirror.

FIGS. 1-4 plot the point-by-point improvement of disk laser structures of the form of that of FIG. 5. In each instance, a first curve (curves 10, 20, 30, 40, respectively) plots the radiation power of the leakage of the prior art device (without an interfering mirror). Radiation power decreases with increasing angle of divergence from the plane of the disk in accordance with $2\sin^{2(M-1)}\Psi$ in which M is the mode number (the number of nodes in the modal path) and $\Psi$ is the angle of diversity from planarity. Curves 11, 21, 31, 41, plot the enhancement factor resulting from placement of a planar gold mirror at 0.3λ spacing from the cavity. The 3rd curve, 12, 22, 32, 42, in each instance is the product of the first two curves. There is no direct correspondence between the peak enhancement factor and the peak in resulting operation. Peak enhancement, markedly for TE operation, corresponds with a fall-off in power for the unaided device (for the prior art device without the interfering mirror). Near-correspondence results in larger net improvement—larger integrated enhancement—for TE operation.

Figure 2:
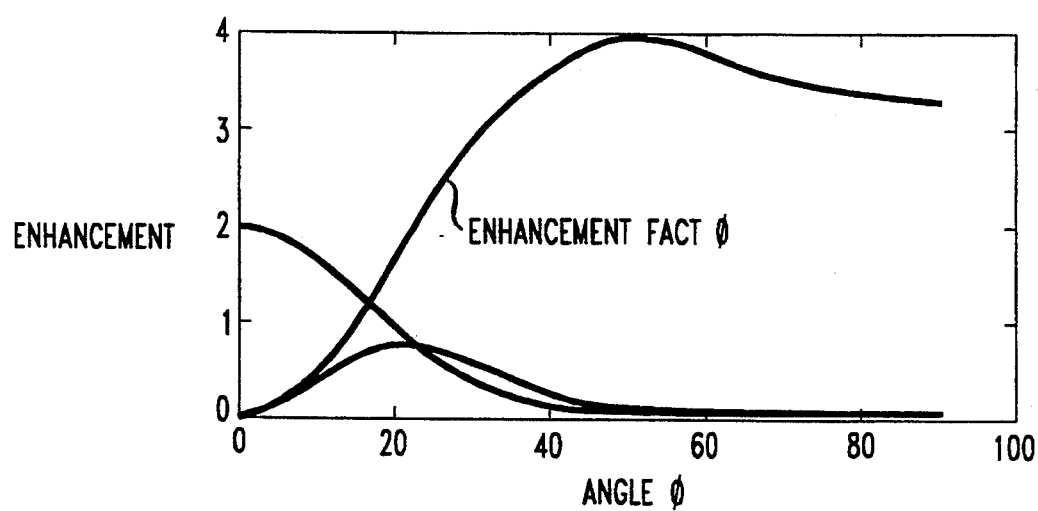

Comparison of FIG. 1 with FIG. 2, and FIG. 3 with FIG. 4, shows greater enhancement for decreasing mode number (for increasing radiation leakage). Decreased mode number corresponds with greater angle of incidence at each node in the resonant path, which in turn signifies greater leakage. The enhancement factor, Q, is 2.00 and 1.93 as compared with 2.54 and 1.76 for TE operation for mode numbers of 8 and 5, for a 0.3λ spacing between the disk and the mirror.

Effective TM microdisk operation is significant in two respects. The large enhancement refutes one expectation. First, the reflected TM waves, in fact, destructively interfere—do not interact constructively. Second, demonstrated feasibility of TM operation, in and of itself, attests to the viability of the integrated microdisk. Optimization of design characteristics, including quantum well thickness, and disk diameter, is expected to lead to use of TM operation supplanting or replacing TE operation.

Discussion in terms of destructive interference is consistent with the likely design approach. Devices based on calculations of interference due to differing path lengths perform as predicted. Path length calculations are, in turn, dependent upon, cavity-to-mirror spacing, penetration depth in the mirror, emission direction (to some extent as affected by mirror placement), refractive indices, etc.

The interfering mirror of the invention is of little effect on closely positioned waveguide structures. Since the magnitude of the interference reaches a significant level only for free space radiation—for radiation of sufficient extent that its cone of rays permits meaningful incidence on the mirror. Usual practice, in providing for a waveguide sufficiently close to capture most of the emission, thereby avoids destructive interference, to leave the emission intensity unchanged.

Device operation may be viewed from a different perspective. Mirror design and placement may be viewed as affecting radiation effectiveness. Viewed as an antenna, the effect of a mirror as positioned, is to lessen antenna efficiency. Reduced antenna efficiency is equivalent to reduced radiation (or reduced leakage). Design criteria are unchanged. It is usual to design antennae by calculating destructive/constructive interference.

Omission of the interfering mirror for defining emission direction, may be sufficient in itself—to usefully serve for displays. By use of multi-layer structures, the effect may be further increased. For example, a surface, Bragg-like, structure may consist of first layer(s) to cancel reflecting radiation which destructively interferes with unreflected radiation (through dastructure interference as between first and second reflecting rays within the structure) together with subsequent (lower) layers to produce rays which constructively interfere amongst themselves and yield a sum which constructively interferes with the unreflected radiation. Delay to result in a total path increase of 360° is, in part, the result of increased index of the Bragg material. Increased path length may, in part, be due to longer free space path to and from a mirror surface which is recessed below the substrate surface.

PHYSICAL DESIGN

FIG. 5 shows a conventional microdisk laser "thumbtack" laser consisting of disk 50 and pedestal 51. Interfering mirror 52 is a deposited metal layer on substrate 53. Use of an interfering mirror under one typical set of conditions permits use of a 3 quantum-well structure (as compared with 5 wells without the mirror), so that disk 50 is made up of 3 successive layers of active material separated by inactive material. See, for example, Appl. Phys. Lett. 60, 289 (1992). Illustrative dimensions correspond with a TIE mode laser operating at 1.55 μm. The diameter of the 5-mode disk 50 is approximately 2μm. The height of pedestal 51, determinative of spacing from the mirror is 0.3λ or 0.465 μm. Mirror 52 is a 0.030 μm thick layer of gold on substrate 53. Consistent with the above description, the size of mirror 52 is sufficient to include a mirror of diameter approximately 3 times that of disk 50, or about 3×3 μm=9 μm diameter. The structure depicted is the one considered for the plotted data on FIG. 1 (corresponding with Example 1).

Figure 6:
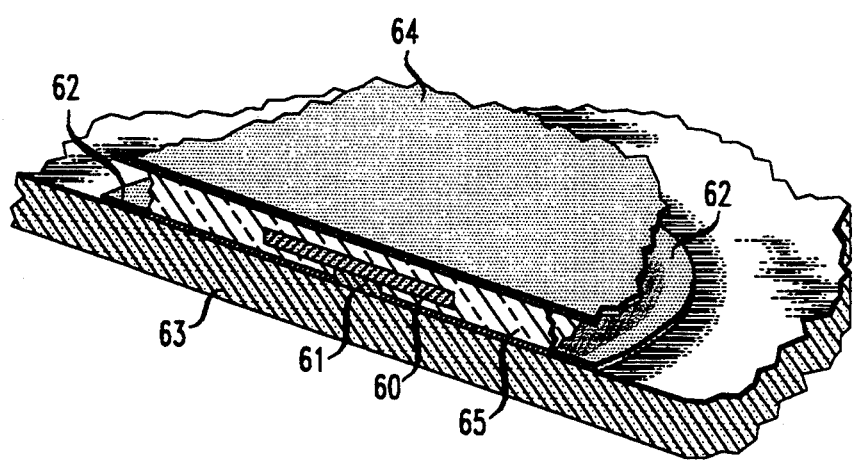
FIG. 6 is a perspective view of a device with dual interfering mirrors.

FIG. 6 is a two-mirror structure otherwise identical to that of FIG. 5. It consists of microdisk 60 supported on pedestal 61, in contact with interfering mirror 62, which is in turn supported by substrate 63. Upper interfering mirror 64 is spaced from disk 60 at a distance equal to the height of pedestal 61. For the particular structure shown, mirror 64 is in parallel spacing with the laser above dielectric filler material 65. For best operation the filler material should have a low dielectric constant. Silica, $SiO_2$, with its dielectric constant of 2.3 at the assumed operating wavelength of 1.55 μm is suitable.

The structure of FIG. 6 suggests a further alterative. Single as well as dual mirror structures may depend for spacing/support on a uniform low-dielectric material, so dispensing with the need for the pedestal. The small penalty in Q resulting from decreased An may be a reasonable price for fabrication expediency. To some extent for single mirror structures, and to greater extent for dual mirror structures, overall Q improvement may offset the penalty. A further alternative may depend on top and bottom pedestals, so retaining the air interface.

It is possible that fabrication cost may be justified under some circumstances.

Presence of an interfering mirror causes a small change in emission direction. The change, resulting in redirection off-axis, away from the mirror, lessens the extent of reflection and, therefore, lessens enhancement. To a certain extent, this may be accommodated by use of a non-planar mirror—of inclined plane parallel to the emission. The dual-mirror structure offers an inherent solution. With equally-spaced mirrors, of equal reflectivity, emission direction is in-plane. The effect is to maintain a degree of interference with each of the two mirrors which exceeds that for the parallel planar mirror of the single mirror structure. The enhancement factor is, accordingly, greater than twice as large.

Figure 7:
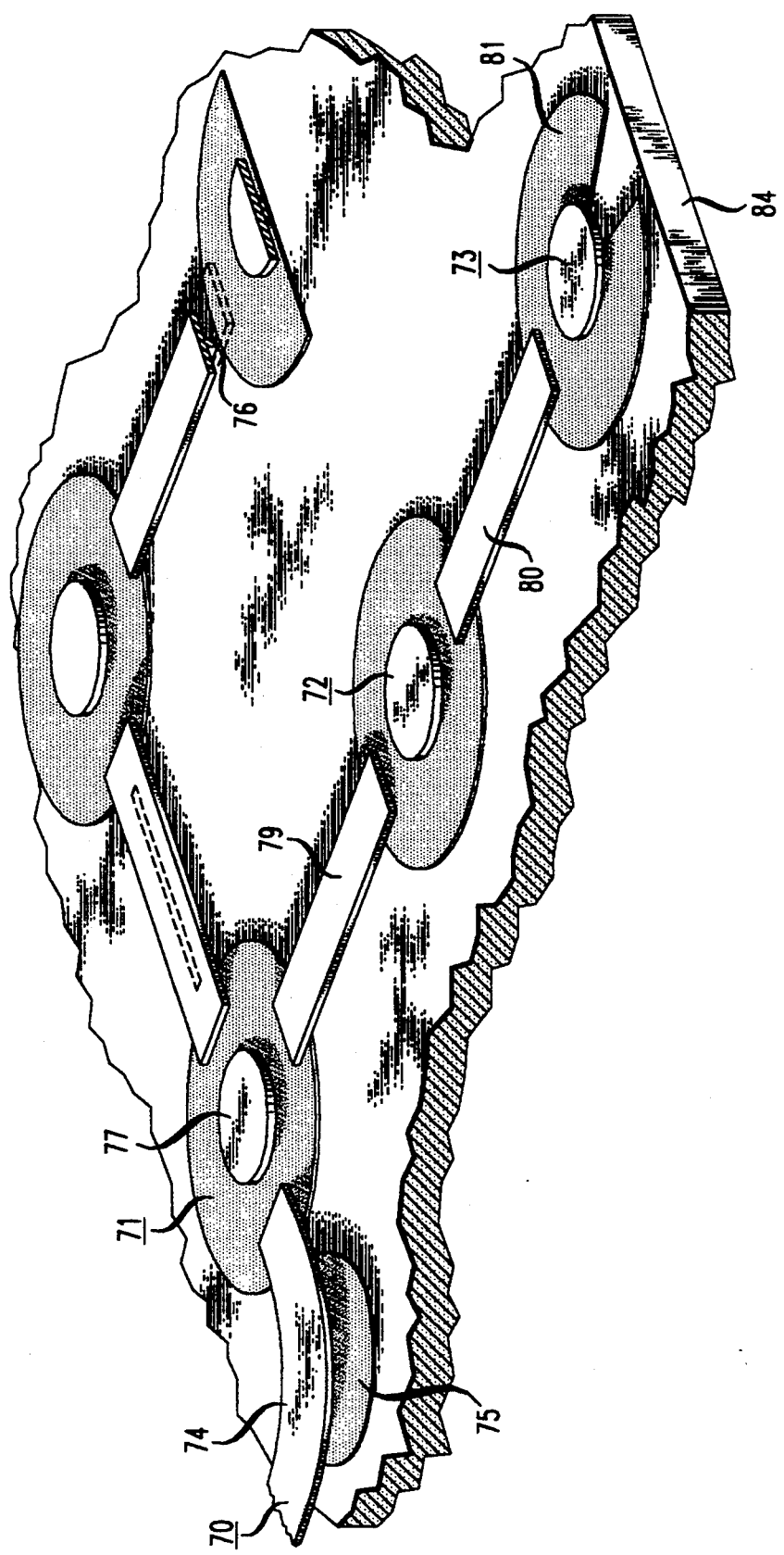
FIG. 7 is a perspective view, partly in section, of an integrated optic circuit, including a variety of bent structures, including: a waveguide; a two-port device operating as a switch, amplifier, or modulator; a spatial switch; and a laser. All are provided with an underlying interfering mirror.

FIG. 7 depicts a portion of an optical circuit. It includes one each of the elements: a bent planar waveguide 70 a 3-port disk device 71, a 2-port device 72, and a laser disk 73. Consistent with earlier discussion elements are described in terms of 1.55 $\mu$m TE mode operation. Waveguide 74 illustratively of InGaAsP is of thickness 0.2 $\mu$m and of width 3 $\mu$m. Reflecting mirror 75 spaced, from guide 74 by pedestals 76 is at 0.465 $\mu$m distance. Device 71, a three-port device which may operate as a spatial switch is similarly provided with a reflecting mirror 77 (which may be continuous with mirror 75). It is supported by a pedestal 78. Device 71 may direct radiation through guide 79, to 2-port device 72. Operating as an on-off switch, device 72, in the on position permits energy to pass into waveguide 80, to optically pump laser 73. Pedestal support for elements 79, 72 and 80, as well as the interfering mirror coupled with element 72 arc as discussed for elements 70 and 71. Mirror 81 spaced from disk 82 by pedestal 83 is discontinuous, defining a non-mirrored region to direct laser emission off the edge of board 84.

FABRICATION

Detailed fabrication procedures are known. See for example, App. Phys. Lett. 60, 289 (1992). A device may be fashioned from epitaxially-grown layered semiconductor material. Illustratively, the device may consist of an InGaAs quantum well layer 100 Å thick sandwiched between 200 Å thick barrier layers of InGaAsP, to result in a total disk thickness of 500Å. Multiple quantum well devices, e.g., the three-well device described, may consist of 3 such 100 Å thick active layers separated by such 200 Å thick barrier layers. Growth is on an InP substrate which is selectively etched to result in retention of a pedestal.

Interfering mirrors are conveniently produced by vapor deposition. Noble metals may be deposited from an elemental vapor (by "evaporation").

EXAMPLES

Examples are in pairs, each pair including a first member representing operation without an interfering mirror (Examples 1, 3, 5); and a second member representing operation for the same apparatus and conditions but including a single interfering mirror (Examples 2, 4, 6). Examples 1 and 2 correspond with FIG. 1; Examples 3 and 4 correspond with FIG. 2. Examples 1-4 are for TE mode operation.

The remaining Examples 5 and 6, show TM mode operation. Again, the first, Example 5, is for operation without an interfering mirror; the second, Example 6, is with an interfering mirror. The TM examples are selected for closest comparison with the TE examples. Selection of TM does however require somewhat different cavity dimensions.

Other work supports reported conclusions: use of a second interfering mirror increases the enhancement by $>2\times$ effect from use of a single mirror structure. Changing spacing; changing dielectric constant of intervening material; changing the material of which laser and ancillary structure is made all affect enhancement value.

Example b 1—M=5, TE operation, no mirror

The apparatus consists of: a laser disk of a diameter of 2.3 $\mu$m, containing three quantum wells each of thickness 100 Å of InGaAs together with intervening nonactive layers each of thickness 200 Å of InGaAsP to a total or 1100 Å, supported by; a 0.45 $\mu$m high pedestal of InP on; a 300 Å thick vapor deposited gold layer; on a two-layer substrate of 300 Å InGaAsP over InP.

The laser is pumped optically by a He-Ne laser. The lasing threshold is 120 $\mu$ watts.

Example 2—M=5, TE operation, 1 interfering mirror

The apparatus of example 1 changed only by an interfering mirror—a gold layer of 150 Å deposited on the substrate surface, with mirror of circular shape, concentric with the disk and of diameter 3 times that of the disk.

Use of the same pump results in onset of lasing at 80 $\mu$ watts.

Example 3—M=8, TE operation, no interfering mirror

The apparatus is identical to that of example 1 except that the laser dimensions are altered to accommodate M=8. The diameter of the disk is 3.6 $\mu$m.

the lasing threshold is 170 $\mu$ watts.

Example 4—M=8, TE operation, 1 interfering mirror

The apparatus is the same as that of example 3, as provided with a 150 Å gold interfering mirror as used in example 2. The lasing threshold is 110 $\mu$ watts.

Example 5—M=12, TM operation, no interfering mirror

The apparatus is identical to that of example 1 but for the dimensions of the disk which are now 2.36 $\mu$m diameter by 0.30 $\mu$m thick. The lasing threshold is 220 $\mu$ watts.

Example 6—M=12, TM operation, 1 interfering mirror

The apparatus of example 5 is altered by inclusion of a gold interfering mirror as described in example 2.

The lasing threshold is 140 $\mu$ watts.

What is claimed is:

1. Apparatus including at least one element including a path for an electromagnetic wave within a body of high refractive index for such energy relative to refractive index of surrounding ambient, at least some portion of the path being curved to a curvature defined by a local radius as bounded at an interface between such body and ambient, the interface defining a convex surface of the high index material, retention of energy within such path being at least partially due to small angle incidence of the energy at the interface, relative refractive indices and curvature at incidence being such as to result in loss by direct radiation from the body, pol CHARACTERIZED IN THAT an interfering mirror is provided as spaced from the body and of such extent that a portion of the radiation is reflected, thereby increasing the path length for reflected radiation, so that it destructively interferes with direct radiation and thereby decreases radiation loss.

2. Apparatus of claim 1 in which the element is a non-resonant waveguide.

3. Apparatus of claim 1 in which the element is a resonant cavity for a peripheral path of at least three wavelengths in length.

4. Apparatus of claim 3 in which the element is of regular shape, and in which the path defines a regular polygon.

5. Apparatus of claim 4 in which the element is a disk defining a modal path of at least five wavelengths.

6. Apparatus of claim 1 in which the interfering mirror is planar, is spaced from the body by a distance $\leqq$ the wavelength, $\lambda$, of the electromagnetic wave, and in which the mirror extends to a distance at least twice as great as the radius defining the curved path.

7. Apparatus of claim 6 in which the element is a peripheral mode resonant disk of regular shape, so that the mirror extends to a distance at least as great as the diameter of the disk.

8. Apparatus of claim 7 in which the element is a whispering mode laser.

9. Apparatus of claim 8 in which the laser mode is TM.

10. Apparatus of claim 8 in which the laser mode is TE.

11. Apparatus of claim 6 in which the interfering mirror consists essentially of a gold layer.

12. Apparatus of claim 6 including a second interfering mirror as defined in that claim, the first and second mirrors sandwiching the body.

13. Apparatus of claim 6 in which spacing corresponds with the height of a supporting pedestal.

14. Apparatus of claim 6 in which spacing corresponds with interposed material of low dielectric constant relative to that of the body.

15. Apparatus of claim 14 in which the interposed material consists essentially of $SiO_2$.

16. Apparatus of claim 6 including a plurality of elements as defined.

17. Apparatus of claim 16 including at least one whispering mode laser.

18. Apparatus of claim 17 including at least one two-port element.

19. Apparatus of claim 17 including at least one three-port element.

20. Apparatus of claim 1 in which interfering mirror is provided about substantially the entirety of the convex surface.

21. Apparatus of claim 20 in which interfering mirror is omitted about a region of the convex surface to permit emission from that region to define an emitting region.

22. Apparatus of claim 21 in which the element is a disk laser.

23. Apparatus of claim 22 in which the emitting region is further provided with means for increasing intensity of emission by constructive interference with reflected radiation.

* * * * *